(12) United States Patent
Splett et al.

(10) Patent No.: US 6,285,063 B1
(45) Date of Patent: Sep. 4, 2001

(54) RESONANT CIRCUIT HAVING A RESONANT BODY MECHANICALLY OSCILLATED BY ELECTROSTATIC OR MAGNETIC FORCES

(75) Inventors: Armin Splett, Ulm; Dieter Emmer, Starnberg, both of (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 09/311,052

(22) Filed: May 13, 1999

(30) Foreign Application Priority Data

May 13, 1998 (DE) .............................. 198 21 527

(51) Int. Cl.[7] .............................. G01P 15/08; H01Q 3/24; H01L 41/08; H01L 41/20; G02B 26/08
(52) U.S. Cl. ........................ 257/415; 257/467; 310/330; 310/332; 315/327; 315/227; 331/40; 331/42; 331/165; 331/128; 331/51; 331/107; 334/30
(58) Field of Search ................... 257/415, 467; 310/330, 332; 315/327, 227; 331/128, 165, 51, 94.1, 107, 42, 40; 334/30

(56) References Cited

U.S. PATENT DOCUMENTS

| | | | | |
|---|---|---|---|---|
| 4,191,905 | * | 3/1980 | Ysuda et al. ...................... | 310/344 |
| 4,266,156 | * | 5/1981 | Kizaki ................................. | 310/344 |
| 5,023,503 | * | 6/1991 | Legge et al. ....................... | 310/311 |
| 5,559,358 | * | 9/1996 | Burns et al. ....................... | 257/431 |
| 5,771,555 | * | 6/1998 | Eda et al. ........................... | 29/25.35 |
| 5,903,380 | * | 5/1999 | Motamedi et al. ................ | 359/224 |

FOREIGN PATENT DOCUMENTS 0 619 494 B1   12/1994   (EP) .

OTHER PUBLICATIONS

Die Grundlagen der Ingenieurs–wissenschaften, Springer–Verlag Berlin, 29. Auflage, 1989, pp. E54–E55.
Handbuch der modernen Funktechnik, 1995, pp. 80–90.
T.W. Kenny, "Micromachined Silicon Tunnel Sensor for Motion Detection", Appl. Phys. Letter 58, 1991, American Institute of Physics, pp. 100–102.
T.W. Kenny, "Electron tunnel Sensors", J. Vac. Sci. Technology, 1992, American Vacuum Society, pp. 2114–2118.
Dressler, Hans–Joachim, Interpolative Analog–Digital Umsetzung von Band., 1993, pp. 64–73.

* cited by examiner

*Primary Examiner*—Alexander O. Williams
(74) *Attorney, Agent, or Firm*—Schiff Hardin & Waite

(57) ABSTRACT

The resonant circuit has at least one resonant body of a semiconductor material anchored on the surface of a semiconductor substrate, at least one first electrode being arranged at said semiconductor material, and at least one second electrode. The first and second electrode are arranged lying opposite one another. When an AC-superimposed DC voltage is applied between the first and the second electrode, the resonant body is excited to mechanical oscillation by the DC voltage. In particular, the resonant circuit can be monoically integrated in electronic circuits.

22 Claims, 5 Drawing Sheets

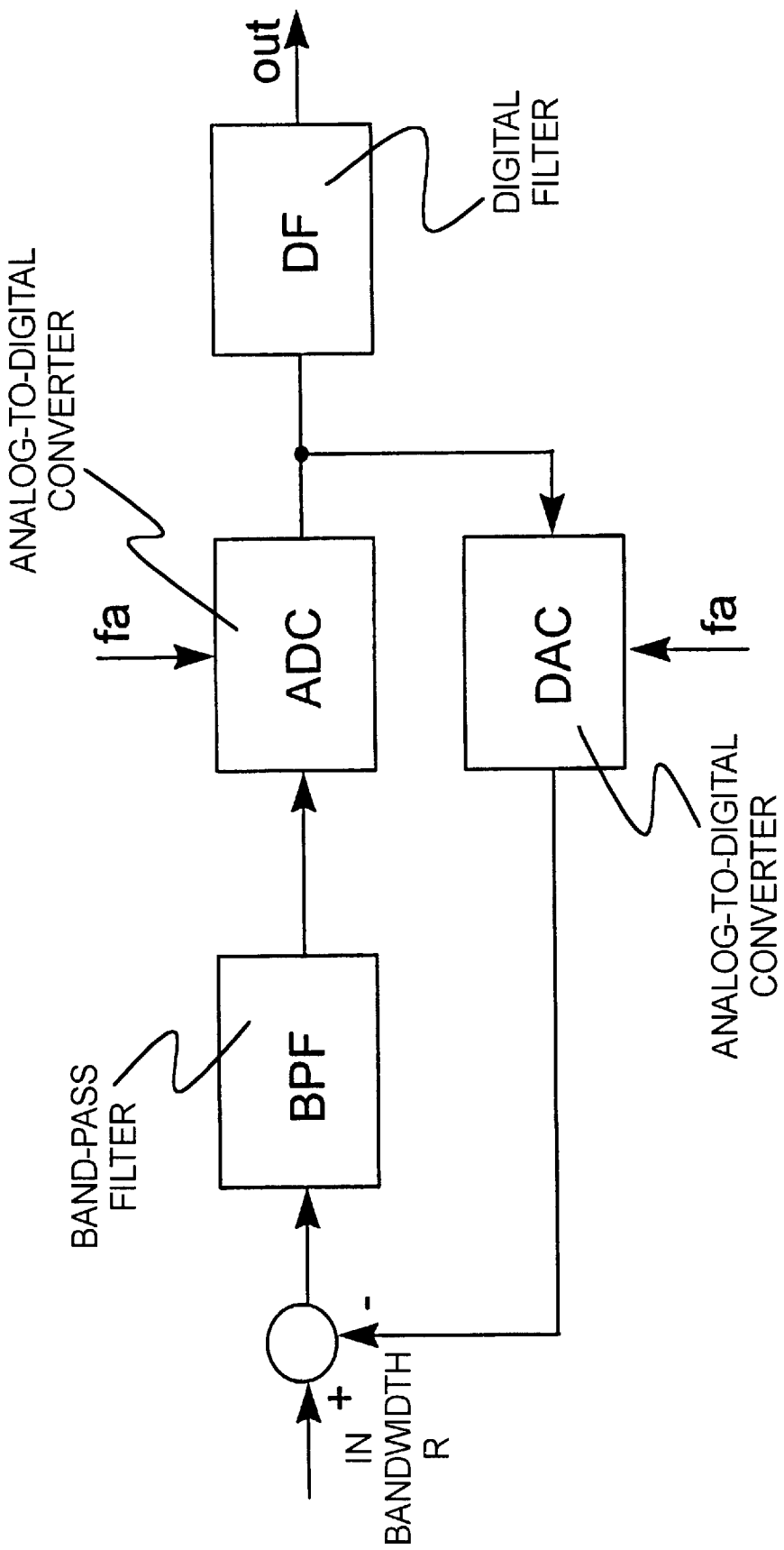

RESONANT CIRCUIT HAVING A RESONANT BODY MECHANICALLY OSCILLATED BY ELECTROSTATIC OR MAGNETIC FORCES

BACKGROUND OF THE INVENTION

The present invention is directed to a resonant circuit, particularly for a monolithic integration in electronic circuits.

High-quality filters and oscillators having low phase noise, which in turn require resonant circuits with high quality, are required for constructing highly selective reception or, respectively, transmission circuits, for example for use in radio communication systems. Increasing miniaturization in electronics means that filters and oscillators must also be available in a suitable size, i.e. in the size of integrated circuits. According to the prior art, such high-quality resonant circuits are realized as discrete elements, for example in the form of surface wave filters or quartz resonators. A complete integratability of these elements in electronic circuits is not possible without further ado because of different substrate materials, as a result whereof these solutions have the disadvantage of a high space requirement and of an increased cost expenditure in manufacture. Electrical resonant circuits, by contrast, can be completely integrated but exhibit the disadvantage of having only low quality that, in particular, is not adequate for application in radio communication systems.

Thge prior art of H. Lobensommer, "Handbuch der modernen Funktechnik", Franzis-Verlag, Poing, 1995, pages 80 through 90, discloses monolithic quartz resonators and surface wave filters. What monolithic means, given quartz resonators, is that the function of a plurality of discrete elements (discrete resonators) is realized on one quartz substrate. The electrode pairs are arranged and dimensioned such on the substrate that the resonance can only form in limited zones. A coupling ridge that determines the respective coupling factor forms between the electrodes. The oscillatory amplitude decreases exponentially outside these zones. The discrete elements or discrete resonators are acoustically connected to one another via the oscillatory energy that is coupled out. Monolithic quartz resonators are manufactured for frequencies of into the range of approximately 100 MHZ. Surface wave filters are manufactured in such a way that a metal layer is vapor-deposited on a single-crystal, piezoelectric substrate and the structure and interdigital transducer is produces with a photo etching technology. Interdigital transducers are comb-like or, respectively, finger-like structures that engage into one another and whose fingers thereby overlap. These structures can comprise more than 100 fingers and respectively form a piezoelectric transducer that can generate and receive surface waves on the substrate.

The publications of T. W. Kenny et al in Appl. Phys. Lett. 58, 100 through 102 (1991) and in J. Vac. Sci. Technol. A 10 (4), 2114 through 2118 (1992) disclose tunnel effect acceleration sensors wherein self-supporting beams or rectangles resiliently anchored due to under-etching are applied on silicon. An excursion of the resilient part as a consequence of forces of inertia given accelerations can be detected with the sensors. These sensors are manufactured by under-etching at the surface of a compact silicon block. European reference EP 0 619 494 discloses a tunnel effect acceleration sensor wherein the manufacture ensues in process steps of micromechanics that are compatible with the technology for manufacturing integrated circuits. This method of manufacture has the advantage that a following electronic circuit can be integrated in the silicon substrate together with the sensor and precision and signal-to-noise ratio of the sensor can thus be significantly improved.

SUMMARY OF THE INVENTION

It is an object of the present invention to provide a resonant circuit that avoids the disadvantages of the resonant circuits of the prior art.

According to the present invention, the resonant circuit has at least one resonant body of semiconductor material anchored on the surface of a semiconductor substrate, at least one first electrode being arranged on the semiconductor material. Further, the resonant circuit has at least one second electrode, whereby the first and second electrode are arranged lying opposite one another. Given application of an AC-superimposed DC voltage between the first and the second electrode, the resonant body is excited to a mechanical oscillation by the superimposed alternating voltage. The coupling between the mechanical oscillation of the resonant body and the electrical oscillation thereby ensues by electrostatic or, respectively, magnetic forces. This inventive realization has the advantage that the resonant body can be monolithically produced on or, respectively, in the semiconductor substrate with micromechanical methods, and a complete integration in electrical circuits is thus enabled given little economic outlay.

According to developments of the present invention, the electrodes can be realized by an electrically conductive doping or by a metallization. As a result of the applied AC voltage, a static electrical field arises between the electrodes, this producing an electrostatic capacitance. The AC voltage superimposed on the DC voltage effects a change of the electrical field and, thus, of the electrostatic forces acting on the beam, whereby the change of the forces causes an excursion of the resonant body. Depending on the geometrical dimensions and on the semiconductor material employed, the resonant body has a mechanical resonant frequency at which it resonates given a correspondingly dimensioned AC voltage. The mechanical resonant frequency of the resonant body in a further development can be varied by heating, whereby the heating can be produced by a flow of current through the first electrode. The electrical equivalent circuit of the resonant circuit essentially corresponds to that of a quartz resonator.

In conformity with first embodiments of the present invention, the resonant body is configured as a bendably anchored beam that is preferably arranged in a cavity in the semiconductor substrate or on the surface of the semiconductor substrate, or as a membrane that is arranged over a cavity in the semiconductor substrate. In particular, the bendably anchored beam has the advantage of a simple manufacture on the basis of known micromechanical manufacturing methods. According to further developments of the present invention, the second electrode is arranged on the semiconductor substrate or on a further bendably anchored beam. The after embodiment advantageously enables a higher efficiency of the resonant circuit since a greater mechanical mass is placed into motion with given electrostatic or, respectively, magnetic forces. Moreover, the further beam can be manufactured in the same way or, respectively, in the same work steps as the beam on which the first electrode is arranged.

In further developments, the resonant body is arranged in a cavity that is formed by a semiconductor layer additionally applied on the semiconductor substrate. The first electrode at the resonant body and the second electrode at the semiconductor layer are arranged lying opposite one another. This embodiment can simplify the manufacturing process for the resonant circuit, as well as, providing very good protection of the resonant body against environmental influences.

According to a further development, the semiconductor substrate and the semiconductor material are respectively based on silicon, gallium-arsenide or other semiconductor materials of the III-V group. This great selection of different semiconductor materials with which the resonant circuit can be realized enables a universal integration of the resonant circuit in the respectively existing semiconductor material, whereby the geometrical dimensions of the resonant body must be matched to the respective physical properties of the semiconductor material.

The inventive resonant circuit is especially advantageously utilized in an oscillator or band-pass filter of a Sigma-Delta transducer. These areas of employment require a high quality of the resonant circuit that is advantageously met by the resonant circuit in its inventive embodiment. For employment in a Sigma-Delta transducer, the band-pass filter can be integrated with the further electronic circuit components in a common electronic circuit, as a result of which the lengths of the electrical connections and, correspondingly, the signal running times between the individual components can be kept advantageously low. This is of great significance particularly given an exemplary use in transmission and reception circuits of radio stations of a radio communication system that work with frequencies in the gigahertz range.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 7 is a block circuit diagram of a Sigma-Delta transducer.

DESCRIPTION OF THE PREFERRED EMBODIMENTS

Figure 1:
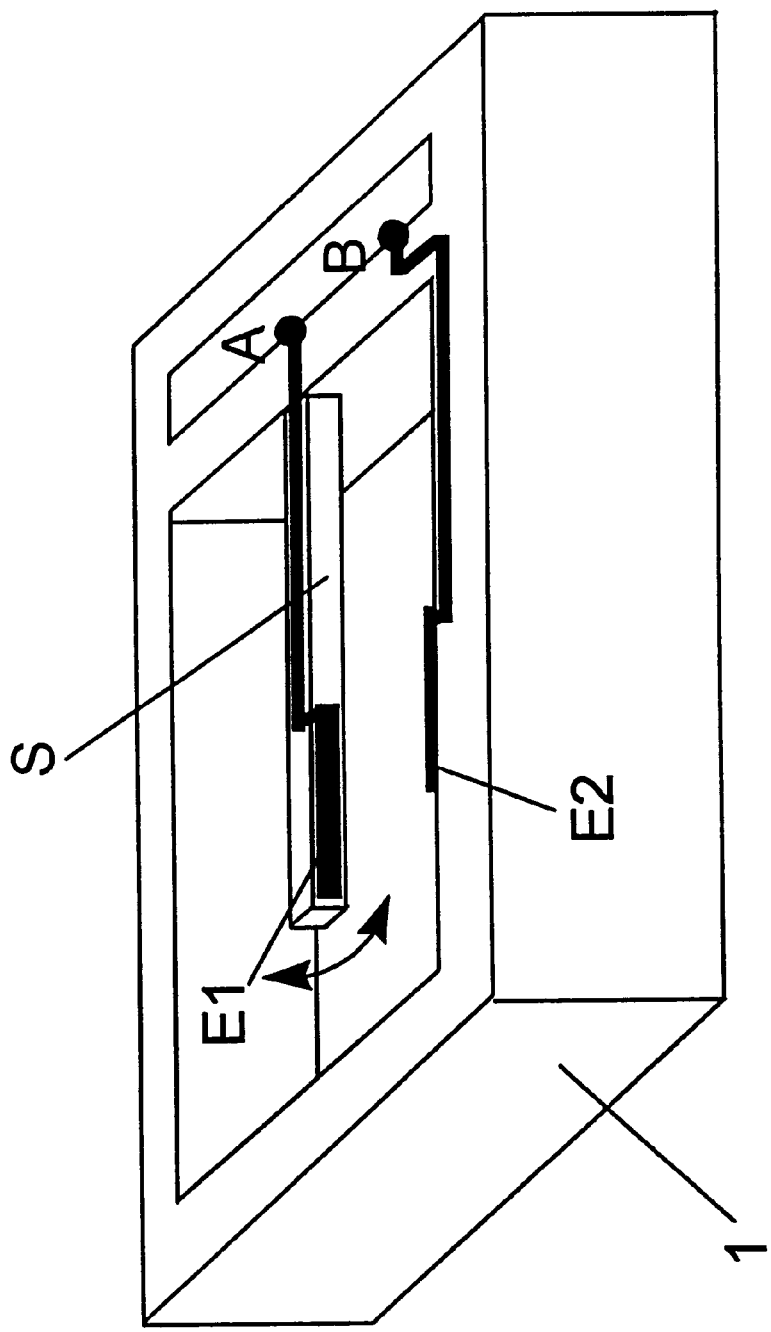
FIG. 1 is an exemplary embodiment of the inventive resonant circuit with a beam as resonant body, shown in an oblique plan view.

FIG. 1 shows a first embodiment of the inventive resonant circuit. A cavity is formed in a semiconductor substrate 1 of, for example, silicon by process steps as known from micromechanics. A resonant body fashioned as a beam S is bendably anchored to the sidewall of this cavity, so that its unattached end can execute motions in at least one dimension. The beam S can be composed of the material of the semiconductor substrate or can be provided with an additional doping for modification of its physical properties. For forming a first electrode E1, the beam S is electrically conductively doped or provided with a metallization. The first electrode E1 can comprise a geometrical expanse over the entire length of the beam S or over only a locally limited part, for example at the free end of the beam S. The first electrode E1 in the first exemplary embodiment is arranged at that side of the beam S lying in viewing direction and is connected to a first electrical contacting A. A second electrode E2 is arranged at the inside of the cavity in the semiconductor substrate lying opposite the first electrode E1, whereby the second electrode E2 is likewise realized by doping or, respectively, metallization and is connected via a connection to a second electrical contacting B.

By applying a DC voltage superimposed with an AC voltage between the electrical contactings A and B, the beam S is placed into a lateral oscillation. The electrical contactings A and B are indicated by way of example for explaining the physical/electrical events in the generation of the oscillation that is discussed in the descriptive part for FIGS. 6a, 6b and FIG. 7. In the practical realization of the resonant circuit in an electronic circuit, they serve, for example, for applying an electrical input signal or, respectively, as transition to preceding or following electronic components that are realized on the same semiconductor substrate.

Figure 2:
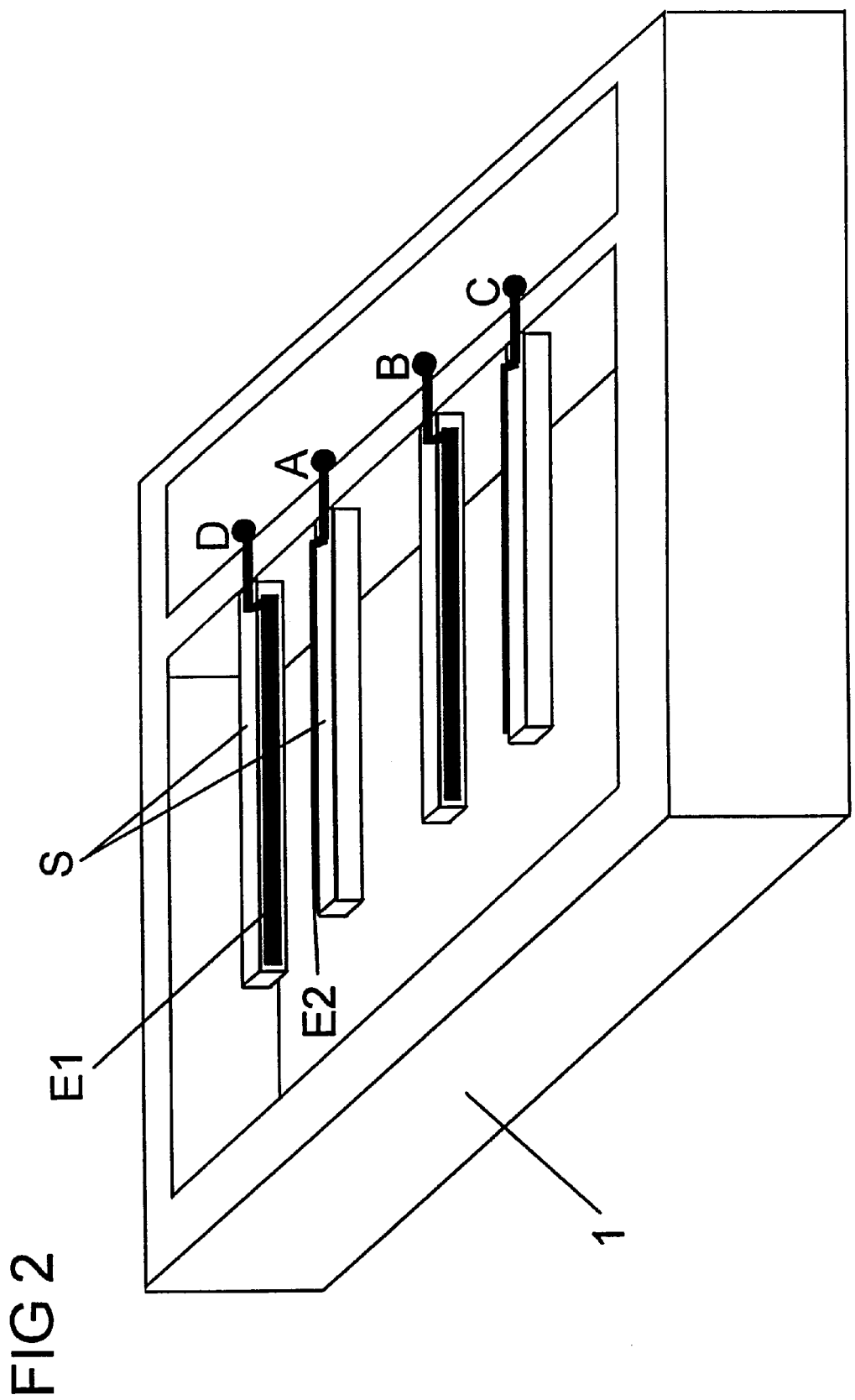
FIG. 2 is an exemplary embodiment of the inventive resonant circuit having a plurality of beams arranged parallel, in an oblique plan view.

The embodiment of an inventive resonant circuit shown in FIG. 2 corresponds to FIG. 1, whereby a plurality of bendably anchored beams S are arranged parallel to one another. An alternative arrangement of the beams S in the form of inter-engaging fingers known from surface wave filters, however, is likewise conceivable. Respectively two beams S comprise electrodes lying opposite one another. In this embodiment, the electrodes are arranged over the entire length of the free-standing beams and lying opposite one another. An electrical quadrupole having the electrical contactings D, A, B, C, for example, can also be realized by the arrangement of two beam pairs, or the quality can be advantageously enhanced by a parallel connection of a plurality of resonant circuits. In the following embodiments of FIGS. 3 through 5, respectively only two electrodes E1 and E2 lying opposite one another are indicated, whereby an expansion of the resonant circuit by additional resonant bodies or, respectively, electrodes is advantageously possible in all examples.

In the embodiment of FIG. 3, the resonant body again fashioned as beam S is, for example, of polysilicon and is bendably anchored at one end on a silicon substrate 1. The first electrode E1 at the beam is realized by a metallization and arranged at that side of the beam S facing toward the silicon substrate 1. The second electrode E2 is arranged on the silicon substrate 1 lying opposite the first electrode E1.

Figure 4:
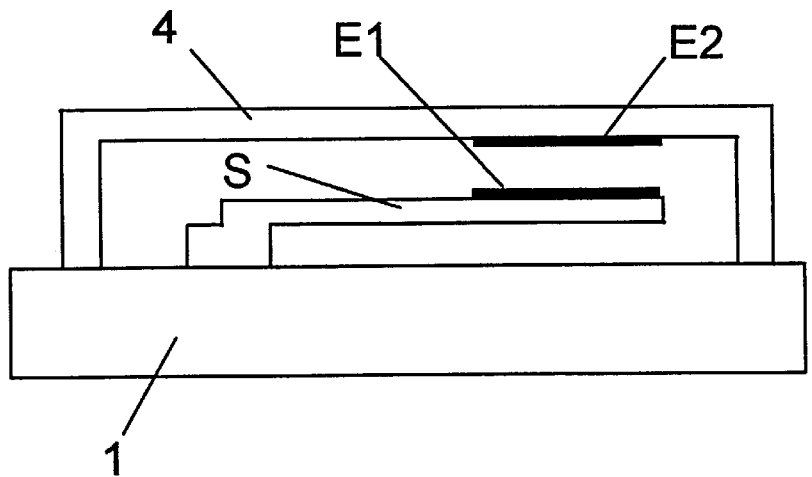
FIG. 4 is an exemplary embodiment of the inventive resonant circuit, whereby the beam is arranged in a cavity, shown in a side view.

In the embodiment of FIG. 4, the beam S is situated in a cavity formed by a polysilicon layer 4. The electrodes E1 and E2 are situated at that side of the beam S facing away from the silicon substrate 1 or, respectively, at the upper inner wall of the polysilicon layer 4. Advantageously, the polysilicon layer 4 over the beam S offers protection against environmental influences that can influence the resonant body. The cavity under the polysilicon layer 4 can be evacuated.

Figure 3:
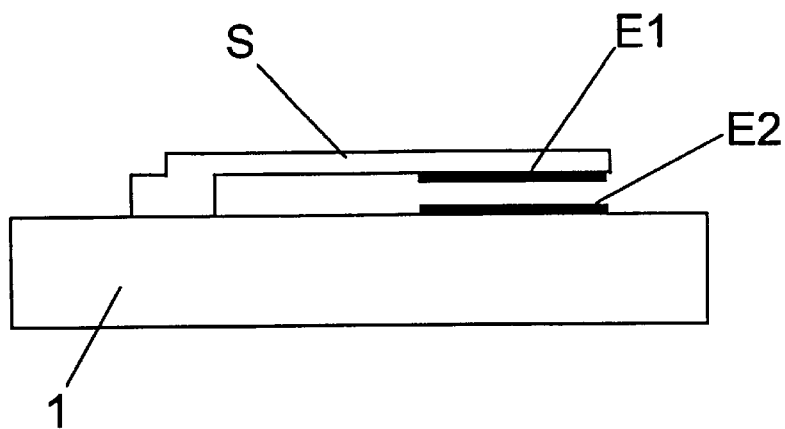
FIG. 3 is an exemplary embodiment of the inventive resonant circuit, whereby the beam is arranged on the surface of the semiconductor substrate, shown in a side view.

As a result of the respective arrangement of the beam S and of the electrodes E1 and E2 in FIG. 3 and in FIG. 4, the beam 2 is placed into a vertical oscillation given application of an AC voltage superimposed with a DC voltage. The electrical contactings of the electrodes E1 or, respectively, E2 are not shown in FIG. 3 and in FIG. 4 but are arranged in conformity with FIG. 1 and FIG. 2.

The manufacturing method for the embodiments according to FIGS. 3 and 4 can be derived, for example, from European reference EP 0 619 494 already cited in the introduction to the specification.

Figure 5:
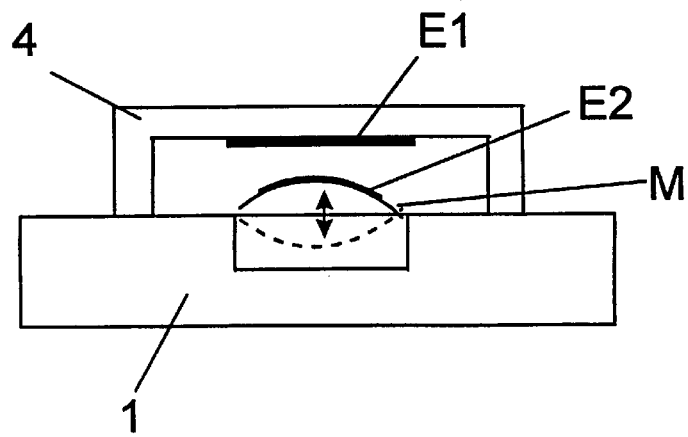
FIG. 5 is an exemplary embodiment of the inventive resonant circuit, whereby the resonant body is implemented as a membrane, shown in a side view.

The exemplary embodiment of FIG. 5 shows a resonant body fashioned as a membrane M. The membrane M is arranged over a cavity in the semiconductor substrate 1 and is anchored at the walls of the cavity or, respectively, at the surface of the semiconductor substrate 1. A first electrode E1 is provided by doping or metallization at the upper side of the membrane M. Corresponding to the exemplary embodiment of FIG. 4, a semiconductor layer 4 forming a cavity is located above the semiconductor substrate 1, a second electrode E2 being arranged at the upper inner wall of said semiconductor layer 4. The cavity is advantageously evacuated in order to enable a free oscillation of the membrane M in vertical direction.

The physical/electrical events in the inventive resonant circuit and the advantageous utilization of the resonant circuit in a Sigma-Delta transducer are explained below with reference to FIG. 4 and FIG. 5, whereby the resonant circuit of the exemplary embodiment of FIG. 1 forms the basis.

The resonant body in FIG. 1 fashioned as beam S has a basic or, respectively, resonant frequency due to its spatial dimensions (length, cross-sectional area, etc.) and the physical properties of the semiconductor material (modolus of elasticity, density, etc.). This basic or, respectively, resonant frequency can be derived according to Hütte, "Die grundlagen der Ingenieurswissenschaften",Springer Verlag Berlin, 29th Edition, 1989, pages E54, E55. The beam S can be excited to execute a flexural oscillation as a result of a force alternately attacking with an excitation frequency. The greatest oscillatory amplitudes thereby derive when the excitation frequency corresponds to the resonant frequency of the beam S. Given resonance, the same characteristics with respect to the impedance can be observed as given the known resonant circuits.

When a first electrode E1 is arranged at one side of the beam S and a second electrode E2 is arranged lying opposite this at a specific distance, as realized by way of example in FIG. 1 at the inside of the cavity in the semiconductor substrate, a plate capacitor fundamentally arises. Given application of an electrical DC voltage between the two electrodes E1, E2, an electrostatic capacitance Cp arises due to the electrical field, as, thus, does an electrostatic force as well that acts on the beam S. When an AC voltage is superimposed on the applied DC voltage, then a dynamic change in capacitance referenced Cs arises between the electrodes E1, E2, this in turn effecting a dynamic change of the influence of the force on the beam S. When the electrically effective electrodes E1, E2, due to their movement, are moved away from one another due to the dynamic influence of force, the electrical capacitance between the electrodes E1, E2 is reduced and the spatial expanse of the electrical field increases. The dynamic capacitance Cs can be approximately assumed as a constant for a sinusoidal alternating voltage indicated by way of example and given the condition that the amplitude of the alternating voltage is far smaller than the height of the voltage of the DC voltage. A magnetic coupling of the mechanical oscillation of the beam S to the electrical oscillation of the applied AC voltage can be derived in the same way.

Figure 6A:
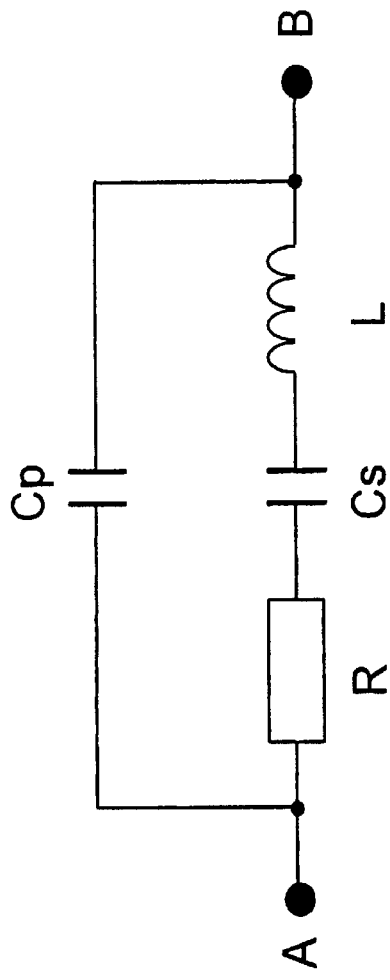
FIGS. 6a and 6b depict an electrical equivalent circuit diagram of the inventive resonant circuit and a transfer function of a band-pass filter.

FIG. 6a shows the electrical equivalent circuit diagram of the resonant circuit that was described above. It essentially corresponds to the equivalent circuit diagram of a quartz resonator. The elements of the resonant circuit are shown between the electrical contactings A and B. The electrostatic capacitance Cp is thereby connected electrically parallel to a series circuit of a dynamic loss resistor R, the dynamic capacitance Cs and a dynamic inductance L. The loss resistance R is produced by mechanical losses due to the oscillation of the beam S as well as due to electrical losses as a result of the arrangement of the electrodes E1 and E2, whereas the inductance L represents the energy stored given movement of the beam S. On the basis of these equivalent quantities, as known, the resonant frequency $f_0$ of the resonant circuit can be calculated. For the basic resonance it reads: $\omega_0^2 = (L*Cs)^{-1}$; with $\omega_0 = 2\pi f_0$. This basic resonance applies both to the parallel resonance as well as to the series resonance of the resonant circuit given the assumption that the dynamic capacitance Cs is far smaller then the static capacitance Cp.

Figure 6B:
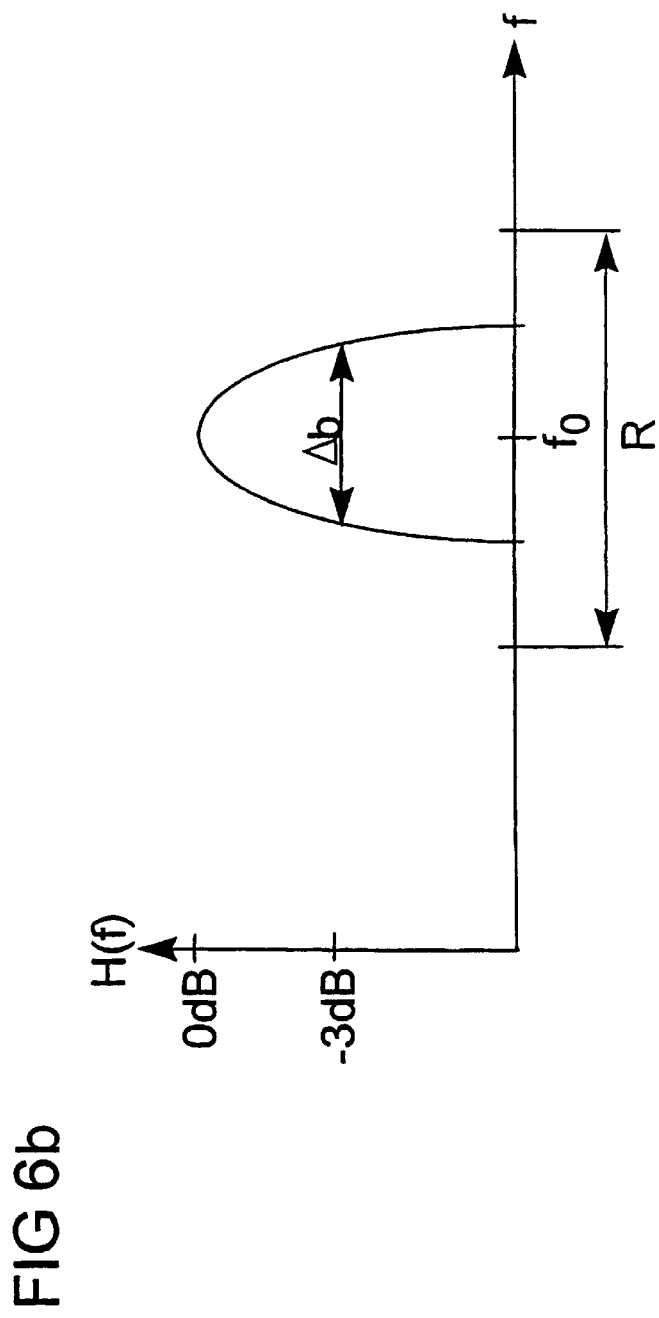

FIG. 6b shows an exemplary transfer function of the described resonant circuit. The quality of the resonant circuit or, respectively, the quality of the filter given a utilization of the resonant circuit in a band-pass filter BPF as indicated by way of example in the Sigma-Delta transducer in FIG. 7 can be determined on the basis of this transfer function. The transfer function H(f) of the band-pass filter BPF is entered on the vertical axis and the frequency f is entered on the horizontal axis. R indicates the bandwidth of the input signal in that is adjacent at the input of the band-pass filter BPF. At the resonant frequency $f_0$, the input signal is not subject to any kind of attenuation whatsoever by the band-pass filter BPF, this being illustrated by the 0 dB marking. The bandwidth $\Delta b$ corresponds to the 3 dB drop of the input signal in and provides information about the quality and selectivity of the resonant circuit or, respectively, band-pass filter BPF. The bandwidth $\Delta b$ decreases given high quality of the resonant circuit and the selectivity correspondingly increases.

For employment of the inventive resonant circuit in a Sigma-Delta transducer, a very high quality in addition to the monolithic intergratability are of great significance. Sigma-Delta transducers are known from, for example, H.-J. Dressier, "Interpolative Analog/Digital-Umsetzung von Bandpassignalen",VDI Fortschritt-Berichte, Series 10: informatik/Komuunikationstechnik No. 237, VDI Verlag, ISBN 3-18-143710-7. The problem of dimensioning the band-pass filter and the conditions placed on it are particularly explained on pages 64 through 73 of this document. Two significant conditions that are met by the inventive resonant circuit are recited on page 66, middle: the ratio of bandwidth $\Delta b$ to the bandwidth R of the input signal in must be lower than 0.25, and the loop running time must be short. The problem of the critical loop running times is advantageously solved by the monolithic integration of the resonant circuit together with, for example, the analog-to-digital converter ADC and the digital-to-analog converter, since the signal running times between the individual components are extremely short. The second condition of the high quality of the band-pass filter BPF is met by the fashioning of the resonant circuit as mechanical resonant body that enables a quality on the order of magnitude of a quartz resonator.

Given an exemplary employment of the band-pass filter BPF in a reception circuit of a radio station of the future mobile radio telephone system of the third generation (UMTS-Universal Mobile Telecommunication System) that works with a bandwidth of R=5 MHz on a carrier frequency of 2.2 GHz (which corresponds to the resonant frequency $f_0$ of the resonant circuit), a required quality $Q>4f_{90}/R=1760$ of the band-pass filter BPF derives. A quality on this order of magnitude cannot be realized by an electrical resonant circuit but can be advantageously realized with the inventive resonant circuit.

FIG. 7 shows the block circuit diagram of a Sigma-Delta transducer. An analog input signal in having the bandwidth R is supplied to a band-pass filter BPF that implements a filtering of the carrier frequency of the input signal in. The filtered analog signal is converted into a digital signal in an analog-to-digital converter ADC with the sampling frequency fa. The digital signal is supplied, to a digital filter DF that filters an output signal out out and applies it for further-processing to, for example, the input of a digital signal processor (DSP), and is sampled in a digital-to-analog converter DAC having the sampling frequency fa and is converted back into an analog signal. The analog output signal of the digital-to-analog converter DAC is compared to the analog input signal in and the difference is formed, whereby the loop is closed.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A resonant circuit comprising:
   at least one resonant body of a semiconductor material anchored at a first portion to a semiconductor substrate;
   at least one first electrode arranged at said semiconductor material said portion spaced from said first portion of the resonant body which mechanically oscillates;
   at least one second electrode not on the resonant body, the first electrode and second electrode being arranged lying opposite and spaced from one another; and
   a mechanical oscillation of the resonant body being effected by application of an AC-superimposed DC voltage between the first and the second electrodes so that one of an electrostatic and magnetic force arising between the first and second electrodes causes said second portion of the resonant body to mechanically oscillate.

2. The resonant circuit according to claim 1, wherein the resonant body is a bendably anchored beam.

3. The resonant circuit according to claim 2, wherein the beam is one of arranged in a cavity in the semiconductor substrate or arranged on the surface of the semiconductor substrate.

4. The resonant circuit according to claim 2, wherein the second electrode is arranged on a further bendably anchored beam.

5. The resonant circuit according to claim 1, wherein the resonant body is a membrane that is arranged over a cavity in the semiconductor substrate.

6. The resonant circuit according to claim 1, wherein the second electrode is arranged on the semiconductor substrate.

7. The resonant circuit according to claim 1, wherein the resonant body is arranged in a cavity that is formed by a semiconductor layer additionally applied on the semiconductor substrate, and wherein the second electrode is arranged at this semiconductor layer.

8. The resonant circuit according to claim 1, wherein at least one of the first electrode and the second electrode is realized by one of an electrically conductor doping and a metallization of the semiconductor material.

9. The resonant circuit according to claim 1, wherein the semiconductor substrate and the semiconductor material is respectively based on one of silicon, gallium-arsenide or other semiconductor material of the III-V group.

10. The resonant circuit according to claim 1, wherein the resonant body has a mechanical resonant frequency that is varied by a heating, whereby the heating is producible by a flow of current through the first electrode.

11. The resonant circuit according to claim 1, wherein the resonant circuit is monolithically integrated in an electronic circuit.

12. The resonant circuit according to claim 11, wherein the electronic circuit is one of an oscillator or band-pass filter of a Sigma-Delta converter.

13. The resonant circuit according to claim 1, wherein the resonant circuit is utilized in a radio station of a radio communication system.

14. A resonant circuit comprising:
   a bendable beam of a semiconductor material anchored on a surface of a semiconductor substrate;
   a cavity formed by a semiconductor layer additionally applied on the semiconductor substrate, the beam being arranged in the cavity;
   at least one first electrode arranged at said semiconductor material on the bendable beam at a portion which mechanically oscillates;
   at least one second electrode arranged at the cavity on said semiconductor layer, the first electrode and second electrode arranged lying opposite one another;
   a mechanical oscillation of the beam being effected by application of an AC-superimposed DC voltage between the first and the second electrodes.

15. The resonant circuit according to claim 14, wherein the second electrode is arranged on a further bendably anchored beam.

16. The resonant circuit according to claim 14, wherein at least one of the first electrode and the second electrode is realized by one of an electrically conductor doping and a metallization of the semiconductor material.

17. The resonant circuit according to claim 14, wherein the semiconductor substrate and the semiconductor material is respectively based on one of a silicon, gallium-arsenide or other semiconductor material of the III-V group.

18. A resonant circuit, comprising:
   a bendable membrane of a semiconductor material anchored on a surface of a semiconductor substrate;
   a cavity formed by a semiconductor layer additionally applied on the semiconductor substrate, the membrane being arranged over the cavity;
   at least one first electrode arranged at said semiconductor material; and
   at least one second electrode arranged at the cavity of said semiconductive layer, the first electrode and the second electrodes being arranged lying opposite one another;
   a mechanical oscillation of the membrane being effected by application of an AC-superimposed DC voltage between the first and the second electrodes.

19. The resonant circuit according to claim 18, wherein at least one of the first electrode and the second electrode is realized by one of an electrically conductor doping and a metallization of the semiconductor material.

20. The resonant circuit according to claim 18, wherein the semiconductor substrate and the semiconductor material is respectively based on one of a silicon, gallium-arsenide or other semiconductor material of the III-V group.

21. Resonant circuit, comprising:
- at least one resonant body comprising a membrane of a semiconductor material arranged over a cavity in a semiconductor substrate, said resonant body being anchored to the semiconductor substrate;
- at least one first electrode arranged on said resonant membrane;
- at least one second electrode not on said resonant body and spaced from said resonant body, the first and second electrodes being arranged lying opposite one another; and
- a mechanical oscillation of the resonant body being effected by application of an AC-superimposed DC voltage between the first and second electrodes.

22. A resonant circuit, comprising:
- at least one resonant body of a semiconductor material anchored to a semiconductor substrate;
- at least one first electrode arranged on said resonant body and a further second electrode spaced from said first electrode and not on the resonant body; and
- a mechanical oscillation of the resonant body being effected by positioning of the first and second electrodes such that application of an AC-superimposed DC voltage between the first and second electrodes a force to arise between the spaced apart first and second electrodes which causes at least a portion of said resonant body to mechanically oscillate.

* * * * *